(12) United States Patent
Choi et al.

(10) Patent No.: US 9,656,499 B2
(45) Date of Patent: May 23, 2017

(54) THERMAL TRANSFER FILM, METHOD FOR MANUFACTURING SAME, AND ORGANIC ELECTROLUMINESCENT ELEMENT MANUFACTURED BY USING THERMAL TRANSFER FILM

(71) Applicant: CHEIL INDUSTRIES INC., Gumi-si, Gyeongsangbuk-do (KR)

(72) Inventors: Jin Hee Choi, Uiwang-si (KR); Kyoung Ku Kang, Uiwang-si (KR); Se Hyun Park, Uiwang-si (KR); Seong Heun Cho, Uiwang-si (KR); Jung Hyo Lee, Uiwang-si (KR)

(73) Assignee: SAMSUNG SDI CO., LTD., Yongin-si (KR)

( * ) Notice: Subject to any disclaimer, the term of this patent is extended or adjusted under 35 U.S.C. 154(b) by 0 days.

(21) Appl. No.: 14/758,477

(22) PCT Filed: Dec. 27, 2013

(86) PCT No.: PCT/KR2013/012250
§ 371 (c)(1),
(2) Date: Jun. 29, 2015

(87) PCT Pub. No.: WO2014/104778
PCT Pub. Date: Jul. 3, 2014

(65) Prior Publication Data
US 2015/0333260 A1  Nov. 19, 2015

(30) Foreign Application Priority Data

Dec. 31, 2012 (KR) .................. 10-2012-0158159
Dec. 10, 2013 (KR) .................. 10-2013-0153520

(51) Int. Cl.
*B41M 5/44* (2006.01)
*H01L 51/00* (2006.01)
(Continued)

(52) U.S. Cl.
CPC .............. *B41M 5/446* (2013.01); *B41M 5/40* (2013.01); *B41M 5/42* (2013.01); *B41M 5/46* (2013.01);
(Continued)

(58) Field of Classification Search
CPC .......... B41M 5/44; B41M 5/446; B41M 5/46; B41M 2205/30; B41M 2205/34;
(Continued)

(56) References Cited

U.S. PATENT DOCUMENTS

| 5,286,559 A | 2/1994 | Kaneko et al. | |
| 8,203,125 B2 * | 6/2012 | Shim | B41M 5/465 106/400 |
| 2009/0047597 A1 * | 2/2009 | Felder | B41M 5/42 430/201 |

FOREIGN PATENT DOCUMENTS

| KR | 10-2007-0084022 | 8/2007 |
| KR | 10-2008-0068463 | 7/2008 |

(Continued)

OTHER PUBLICATIONS

International Search Report, corresponding to PCT/KR2013/012250, dated May 9, 2014, 4 pages.

*Primary Examiner* — Bruce H Hess
(74) *Attorney, Agent, or Firm* — Lewis Roca Rothgerber Christie LLP

(57) ABSTRACT

The present invention relates to a thermal transfer film, a method for manufacturing the same, and an organic electroluminescent element manufactured by using the thermal transfer film, and the thermal transfer film comprises: a base film; a photothermal conversion layer formed on the upper part of the base film; and a coating layer formed on the lower part of the base film.

17 Claims, 3 Drawing Sheets

(51) Int. Cl.
*H01L 51/50* (2006.01)
*B41M 5/40* (2006.01)
*B41M 5/42* (2006.01)
*B41M 5/46* (2006.01)

(52) U.S. Cl.
CPC ..... *H01L 51/0013* (2013.01); *B41M 2205/30* (2013.01); *B41M 2205/34* (2013.01); *B41M 2205/36* (2013.01); *B41M 2205/38* (2013.01); *B41M 2205/40* (2013.01); *H01L 51/5012* (2013.01)

(58) Field of Classification Search
CPC .......... B41M 2205/36; B41M 2205/38; B41M 2205/40; H01L 51/00; H01L 51/0013; H01L 51/50; H01L 51/5012
USPC ...................................................... 428/32.81
See application file for complete search history.

(56) References Cited

FOREIGN PATENT DOCUMENTS

| | | |
|---|---|---|
| KR | 10-2012-0053660 | 5/2012 |
| KR | 10-2012-0138691 | 12/2012 |

* cited by examiner

THERMAL TRANSFER FILM, METHOD FOR MANUFACTURING SAME, AND ORGANIC ELECTROLUMINESCENT ELEMENT MANUFACTURED BY USING THERMAL TRANSFER FILM

CROSS-REFERENCE TO RELATED APPLICATION(S)

This application is a National Phase Patent Application and claims priority to and the benefit of International Application Number PCT/KR2013/012250, filed on Dec. 27, 2013, which claims priority to Korean Patent Application Number 10-2012-0158159, filed on Dec. 31, 2012, and Korean Patent Application Number 10-2013-0153520, filed on Dec. 10, 2013, the entire contents of all of which are incorporated herein by reference.

TECHNICAL FIELD

The present invention relates to a thermal transfer film, a method for manufacturing the same, and an organic electroluminescent device manufactured using the same.

BACKGROUND ART

A thermal transfer film may be used as a donor film in formation of patterns. The thermal transfer film includes a base film and a light-to-heat conversion layer formed on the base film, in which a transfer layer including an organic luminescent material is formed on the light-to-heat conversion layer in formation of patterns. The light-to-heat conversion layer is required to prevent decrease in optical density for light-induced thermal transfer and to have low and uniform surface roughness for uniform thermal transfer. The thermal transfer film may further include an interlayer on the light-to-heat conversion layer. Surface roughness of the interlayer can become an important factor capable of reducing transfer failure of the transfer layer.

The base film is a film subjected to coating and may include a primer (generally, particles) formed using materials such as polyurethane, polyester, and the like on a surface thereof. The primer provides good slip properties to the base film and prevents generation of scratches upon roll winding.

The thermal transfer film may be provided as a final product through roll winding after manufacture thereof. FIG. 3 shows a stack (a) of a thermal transfer film wound on a roll 2 in a process of manufacturing a thermal transfer film 1, and a thermal transfer film (b) produced from the stack (a). Referring to FIG. 3, the stack (a) of the thermal transfer film is produced by winding a thermal transfer film 1, which includes a base film 10 having a primer 13 formed thereon, a light-to-heat conversion layer 11 and an interlayer 12, on a roll 2. In this case, indentations 14 having a shape corresponding to the shape of the primer can be formed on the interlayer 12 of the thermal transfer film by winding pressure of the roll and the primer 13 of the baser film 10 of the thermal transfer film. The indentations 14 can deteriorate surface roughness of the interlayer and can cause transfer failure of the transfer layer upon light-to-heat transfer, since the transfer layer is formed on the interlayer. Although the thermal transfer film is shown as being composed of the base film, the light-to-heat conversion layer, and the interlayer in FIG. 3, the indentations can be formed on a thermal transfer film composed of a base film and a light-to-heat conversion layer.

DISCLOSURE

Technical Problem

It is one aspect of the present invention to provide a thermal transfer film that can prevent transfer failure upon thermal transfer by resolving a problem of indentations formed on a light-to-heat conversion layer or an interlayer due to a primer of a base film, upon roll winding of the thermal transfer film.

Technical Solution

In accordance with one aspect of the present invention, a thermal transfer film may include a base film; a light-to-heat conversion layer formed on an upper side of the base film; and a coating layer formed on a lower side of the base film.

In accordance with another aspect of the present invention, a method for manufacturing the thermal transfer film may include coating a composition for the coating layer on a lower side of a base film, coating a composition for a light-to-heat conversion layer on an upper surface of the base film, and curing the composition for the coating layer and the composition for the light-to-heat conversion layer.

In accordance with a further aspect of the present invention, an organic electroluminescent device may be manufactured using the thermal transfer film as a donor film for laser transfer.

Advantageous Effects

The present invention provides a thermal transfer film that can prevent transfer failure upon thermal transfer by resolving a problem of indentations formed on an outermost layer, that is, a light-to-heat conversion layer or an interlayer, due to a primer of a base film upon roll winding of the thermal transfer film.

BEST MODE

Figure 1:
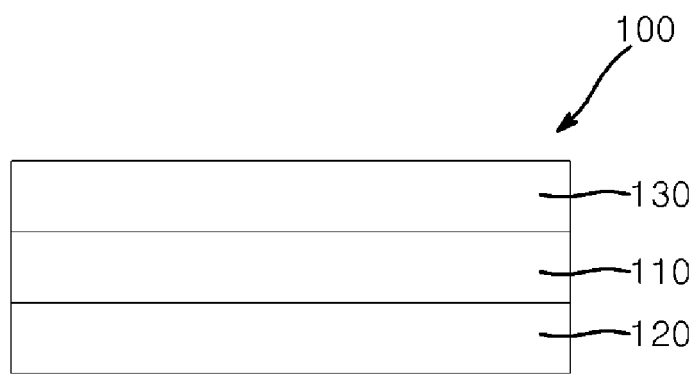
FIG. 1 is a cross-sectional view of a thermal transfer film according to one embodiment of the present invention.

Embodiments of the present invention will be described in detail with reference to the accompanying drawings. It should be understood that the present invention is not limited to the following embodiments and may be embodied in different ways. In the drawings, portions irrelevant to the description will be omitted for clarity. Like components will be denoted by like reference numerals throughout the specification. As used herein, directional terms such as "upper" and "lower" are defined with reference to the accompanying drawings. Thus, it will be understood that an "upper side" can be used interchangeably with a "lower side".

Next, a thermal transfer film according to one embodiment of the invention will be described with reference to FIG. 1. FIG. 1 is a cross-sectional view of a thermal transfer film according to one embodiment of the present invention.

Referring to FIG. 1, a thermal transfer film 100 according to one embodiment of the invention may include a base film 110, a light-to-heat conversion layer 130 formed on an upper side of the base film 110, and a coating layer 120 formed on a lower side of the base film 110. Although not shown in FIG. 1, the base film 110 has a primer on the lower side thereof. The coating layer 120 is formed at a side of the base film 110 at which the primer is formed, thereby preventing formation of indentations on the light-to-heat conversion layer of the thermal transfer film contacting with the base film due to the primer of the base film upon roll winding of the thermal transfer film. As a result, after the thermal transfer film is wound on a roll, surface roughness of the light-to-heat conversion layer may not be increased, thereby preventing transfer failure of the thermal transfer film.

In one embodiment of the invention, the thermal transfer film may have small variation in surface roughness of the light-to-heat conversion layer before and after roll winding. Here, both before and after roll winding, the light-to-heat conversion layer may have a surface roughness Rq of about 5 nm or less, specifically about 3 nm or less, more specifically about 0.1 nm to 2 nm, and a surface roughness RqV of about 50 nm or less, specifically about 40 nm or less, more specifically about 1 nm to 34 nm. Within this range of surface roughness, the light-to-heat conversion layer of the thermal transfer film may have low surface roughness, thereby preventing transfer failure.

Figure 3:
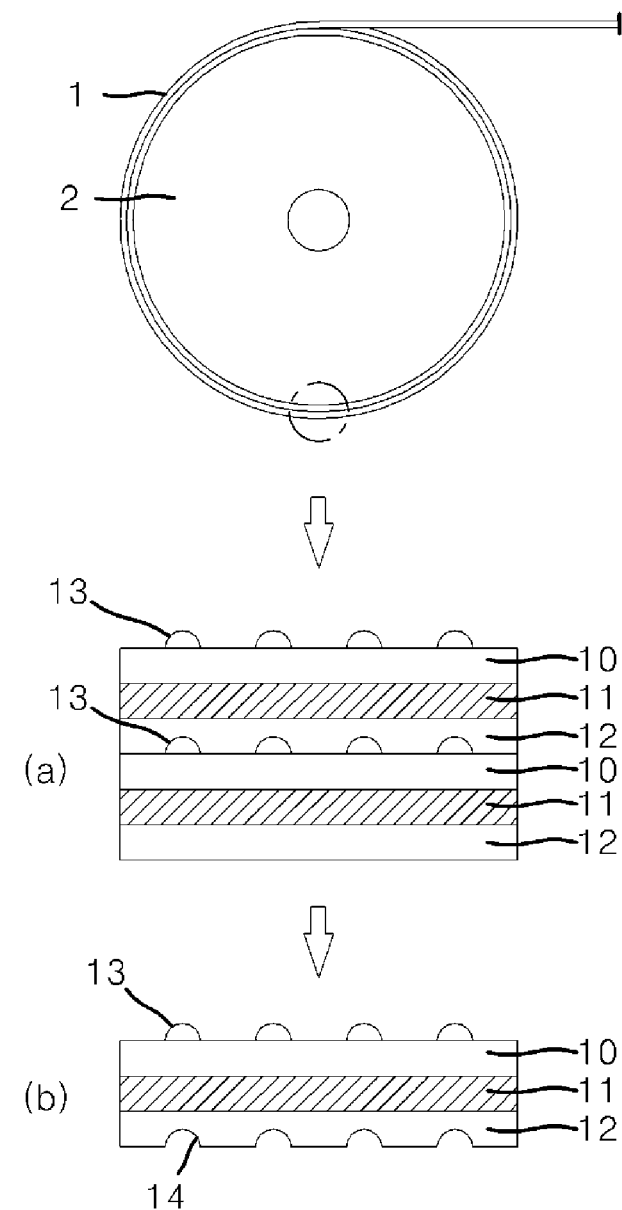
FIG. 3 is a diagram illustrating formation of indentations on a thermal transfer film due to a primer of a base film during roll winding.

The primer serves to prevent damage to the surface of the base film due to friction in the manufacturing process of the thermal transfer film, to prevent the thermal transfer film from attaching to itself in a wound state, and to facilitate moving in the course of production. Although not shown in FIG. 1, the primer may be formed on one or both sides of the base film. As shown in FIG. 3, the primer may be particles formed on one or both sides of the base film in order to improve productivity and storage thereof.

Although the primer particles may be randomly formed at any place on one side of the base film, the primer particles may be arranged at an interval of about 0.1 μm to 1 μm to prevent formation of indentations on the light-to-heat conversion layer upon roll winding of the thermal transfer film, thereby reducing transfer failure. In addition, although the primer may have any height on one side of the base film, the primer may have a height of about 50 nm to about 200 nm to prevent formation of indentations on the light-to-heat conversion layer of the thermal transfer film, thereby reducing transfer failure.

The primer may be composed of a urethane resin and silica particles, and the arrangement intervals and/or the height of the primer may be regulated by controlling the contents of the urethane resins and the silica particles upon formation of the primer on the base film.

The coating layer 120 may be a transparent layer and thus may not influence thermal transfer of the thermal transfer film by enhancing transmittance of light upon thermal transfer. Specifically, in the wavelength range of visible light, the coating layer may have a haze of about 2% or less, specifically about 0.01% to about 1%, and a transmittance of about 88% or more, specifically about 90% or more, more specifically about 90% to about 99%. Within these ranges, the coating layer can prevent transfer failure by securing low surface roughness without deteriorating light penetration efficiency of the light-to-heat conversion layer.

The thickness of the coating layer may be determined by taking into account the particle size of the primer, which can vary according to the base film. In one embodiment, the coating layer may have a thickness of about 500 nm to about 10 μm. Specifically, the coating layer may have a thickness of about 500 nm to about 5 μm in order to sufficiently cover the primer particles. Within this range, the coating layer can cover the primer particles (having a size of about 300 nm) of the base film, thereby preventing formation of indentations upon roll winding of the thermal transfer film.

The coating layer may be a fluorine-based coating layer. As used herein, the term 'fluorine-based coating layer' may mean a coating layer containing fluorine. Specifically, the coating layer may be formed of a composition including a UV curable fluorine compound, thereby relieving roughness due to the primer particles while adjusting surface energy of the base film to suit for a transfer process.

In one embodiment, the coating layer may be formed of a composition including a UV curable resin, a polyfunctional monomer, and an initiator. In another embodiment, the coating layer may be formed of a composition including a UV curable resin, a polyfunctional monomer, a UV curable fluorine compound, and an initiator. Particularly, the coating layer may be formed of the UV curable fluorine compound to form a fluorine-based coating layer, thereby providing suitable surface energy for any transfer process through adjusting the surface energy of the base film.

The UV curable resin may be a non-fluorine resin that is free from fluorine, and may include a di- or higher functional resin, preferably a difunctional to hexafunctional resin. Specifically, the UV curable resin may include at least one selected from the group consisting of urethane (meth)acrylate resins, (meth)acrylate resins, phenolic resins, polyvinylbutyral resins, polyvinylacetate resins, polyvinyl acetal resins, polyvinylidenechloride resins, cellulose ether resins, cellulose ester resins, nitrocellulose resins, polycarbonate resins, polyalkyl(meth)acrylate resins including polymethylmethacrylate and the like, epoxy (meth)acrylate resins, epoxy resins, alkyd resins, spiroacetal resins, polybutadiene resins, polythiolpolyene resins, and acrylic resins, without being limited thereto. For example, the UV curable resin may be a urethane (meth)acrylate resin.

The polyfunctional monomer may be a non-fluorine monomer that is free from fluorine or a fluorine monomer that includes fluorine, and may be a di- or higher functional monomer, preferably a trifunctional to hexafunctional monomer. Specifically, the polyfunctional monomer may include at least one of a polyfunctional (meth)acrylate monomer of a polyhydric alcohol and a fluorinated polyfunctional (meth)acrylate monomer. For example, the polyfunctional monomer may include at least one selected from polyfunctional (meth)acrylate monomers selected from the group consisting of ethyleneglycol di(meth)acrylate, diethylene glycol di(meth)acrylate, triethyleneglycol di(meth)acrylate, 1,4-butanediol di(meth)acrylate, 1,6-hexanediol di(meth)acrylate, neopentylglycol di(meth)acrylate, pentaerythritol di(meth)acrylate, pentaerythritol tri(meth)acrylate, pentaerythritol tetra(meth)acrylate, dipentaerythritol di(meth)acrylate, dipentaerythritol tri(meth)acrylate, dipentaerythritol penta(meth)acrylate, dipentaerythritol hexa(meth)acrylate, bisphenol A di(meth)acrylate, trimethylolpropane tri(meth)acrylate, ditrimethylolpropane tri(meth)acrylate, ditrimethylolpropane tetra(meth)acrylate, and propyleneglycol di(meth)acrylate; and fluorinated polyfunctional (meth)acrylate monomers obtained by fluorination of the polyfunctional (meth)acrylate monomers, without being limited thereto.

The initiator is a photo initiator typically used in the art. In one embodiment, the initiator may be a benzophenone compound such as 1-hydroxycyclohexylphenyl ketone, without being limited thereto.

The UV curable fluorine compound may be represented by Formula 1:

(wherein Formula 1, $R^1$ is a hydrogen atom or a linear or branched $C_1$ to $C_5$ alkyl group, and $R^f$ has one structure of Formulae a to e:

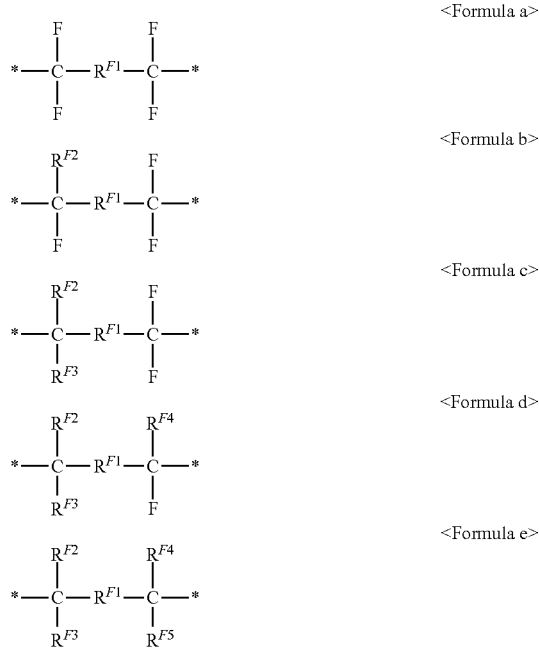

(where * is a binding site for $CH_2=CR^1-C(=O)-O$ represented by Formula 1; $R^{F1}$ is a linear or branched $C_1$ to $C_{10}$ fluoroalkylene group, or a linear or branched $C_1$ to $C_{10}$ perfluoroalkylene group; and $R^{F2}$, $R^{F3}$, $R^{F4}$, $R^{F5}$ are each independently a hydrogen atom, a linear or branched $C_1$ to $C_{14}$ fluoroalkyl group, or a linear or branched $C_1$ to $C_{14}$ perfluoroalkyl group). For example, the UV curable fluorine compound may be 1H,1H,10H, 10H-perfluoro-1,10-decane-diol di(meth)acrylate.

The coating layer may be formed of a composition comprising about 40 wt % to about 90 wt % of the UV curable resin, for example, about 40 wt % to 80 wt % or about 55 wt % to 80 wt % of the UV curable resin, about 5 wt % to 45 wt % of a polyfunctional monomer, optionally, about 10 wt % or less of the UV curable fluorine compound, and about 0.1 wt % to about 5 wt % of the initiator in terms of solid content. Within this range of the composition, the coating layer can relieve roughness due to the primer particles of the base film upon roll winding of the thermal transfer film. For example, the UV curable resin may be included in an amount of about 50 wt % to about 70 wt %, for example, about 50 wt %, 51 wt %, 52 wt %, 53 wt %, 54 wt %, 55 wt %, 56 wt %, 57 wt %, 58 wt %, 59 wt %, 60 wt %, 61 wt %, 62 wt %, 63 wt %, 64 wt %, 65 wt %, 66 wt %, 67 wt %, 68 wt %, 69 wt %, or 70 wt %; the polyfunctional monomer may be included in an amount of about 10 wt % to about 30 wt %, for example, about 10 wt %, 11 wt %, 12 wt %, 13 wt %, 14 wt %, 15 wt %, 16 wt %, 17 wt %, 18 wt %, 19 wt %, 20 wt %, 21 wt %, 22 wt %, 23 wt %, 24 wt %, 25 wt %, 26 wt %, 27 wt %, 28 wt %, 29 wt %, or 30 wt %; the UV curable fluorine compound may be optionally included in an amount of 5 wt % or less, for example, about 0 wt %, 1 wt %, 2 wt %, 3 wt %, 4 wt % or 5 wt %; and the initiator may be included in an amount of about 0.1 wt % to about 3 wt %, for example, about 0.1 wt %, 1 wt %, 2 wt % or 3 wt %.

In one embodiment, the coating layer may be formed of a composition comprising: about 60 wt % to about 80 wt % of the UV curable resin; about 10 wt % to about 30 wt % of the polyfunctional monomer; about 1 wt % to about 5 wt % of the UV curable fluorine compound; and about 0.1 wt % to about 5 wt % of the initiator. Within this range of the composition, the coating layer can relieve roughness due to the primer particles of the base film upon roll winding of the thermal transfer film. In another embodiment, the coating layer may be formed of a composition comprising: about 65 wt % to about 90 wt % of the UV curable resin; about 5 wt % to about 30 wt % of the polyfunctional monomer, preferably, 5 wt % to about 25 wt %; and about 1 wt % to about 5 wt % of the initiator. Within this range of the composition, the coating layer can relieve roughness due to the primer particles of the base film upon roll winding of the thermal transfer film.

The composition for the coating layer may further include a solvent to facilitate coating. Examples of the solvent may include methylethylketone and propyleneglycolmonomethyletheracetate, without being limited thereto. The composition for the coating layer may further include additives. The additives may include a surface energy regulator, additives for improving coating properties, and the like.

The coating layer may be formed by a typical process using the composition for the coating layer. In one embodiment, the composition for the coating layer is coated onto a lower side of the base film, that is, a surface of the base film opposing to the light-to-heat conversion layer, followed by drying and curing under UV curing conditions in a nitrogen atmosphere.

The base film 110 may be a transparent polymer film. Specifically, the base film may include at least one of polyester resins, polyacrylic resins, polyepoxy resins, polyolefin resins including polyethylene resins, polypropylene resins, and the like, and polystyrene resins. For example, the base film may be a polyethylene terephthalate (PET) film or a polyethylene naphthalate film. The base film may include a single layer, or multiple layers in which two or more layers are stacked.

The base film may have a thickness of about 10 μm to about 500 μm, preferably about 50 μm to about 250 μm. Within this range, the base film can be used in the thermal transfer film.

The light-to-heat conversion layer 130 may include a composition comprising a light-to-heat conversion material, a binder, and an initiator.

The light-to-heat conversion material may include at least one of dyes and pigments typically applicable to the light-to-heat conversion layer. For example, the light-to-heat conversion material may include at least one of carbon black and fine tungsten oxide particles.

The binder may include a UV curable resin, a polyfunctional monomer, or a mixture thereof.

The UV curable resin may include at least one selected from the group consisting of (meth)acrylate resins, phenolic resins, polyvinylbutyral resins, polyvinylacetate resins, polyvinylacetal resins, polyvinylidenechloride resins, cellulose ether resins, cellulose ester resins, nitrocellulose resins, polycarbonate resins, polyalkyl (meth)acrylate resins including polymethyl methacrylate and the like, epoxy (meth)acrylate resins, epoxy resins, ester resins, ether resins, alkyd resins, spiroacetal resins, polybutadiene resins, polythiolpolyene resins, (meth)acrylate resins of polyfunctional compounds of polyhydric alcohols, and acrylic resins, without being limited thereto. Preferably, the UV curable resin may include epoxy (meth)acrylate resin or a mixture thereof.

The UV curable resin may be included in an amount of about 40 wt % to about 80 wt %, for example, about 50 wt % to about 70 wt % in the light-to-heat conversion layer or in the composition for the light-to-heat conversion layer in terms of solid content.

The polyfunctional monomer may a di- or higher functional monomer, preferably a tri-functional to hexa-functional monomer. For example, the polyfunctional monomer may include at least one of a polyfunctional (meth)acrylate monomer derived from hydroxyl groups of a polyhydric alcohol and a fluorinated polyfunctional (meth)acrylate monomer. Specifically, the polyfunctional monomer may include at least one selected from polyfunctional (meth)acrylate monomers selected from the group consisting of ethyleneglycol di(meth)acrylate, diethylene glycol di(meth)acrylate, triethyleneglycol di(meth)acrylate, 1,4-butanediol di(meth)acrylate, 1,6-hexanediol di(meth)acrylate, neopentylglycol di(meth)acrylate, pentaerythritol di(meth)acrylate, pentaerythritol tri(meth)acrylate, pentaerythritol tetra(meth)acrylate, dipentaerythritol di(meth)acrylate, dipentaerythritol tri(meth)acrylate, dipentaerythritol penta(meth)acrylate, dipentaerythritol hexa(meth)acrylate, bisphenol A di(meth)acrylate, trimethylolpropane tri(meth)acrylate, ditrimethylolpropane tri(meth)acrylate, ditrimethylolpropane tetra(meth)acrylate, and propyleneglycol di(meth)acrylate; and fluorinated polyfunctional (meth)acrylate monomers obtained by fluorination of the polyfunctional (meth)acrylate monomers, without being limited thereto.

The polyfunctional monomer may be included in an amount of about 1 wt % to about 30 wt %, preferably about 10 wt % to about 25 wt % in the light-to-heat conversion layer or in the composition for the light-to-heat conversion layer in terms of solid content.

The initiator may be a photo initiator typically used in the art. In one embodiment, the initiator may be a benzophenone compound such as 1-hydroxycyclohexyl phenyl ketone, without being limited thereto.

The light-to-heat conversion layer may be formed of a composition comprising: about 1 wt % to about 30 wt % of the light-to-heat conversion material; about 60 wt % to about 90 wt % of the binder; and about 0.1 wt % to about 20 wt % of the initiator in terms of solid content. Within this range of the composition, the light-to-heat conversion layer can absorb light at a wavelength of about 950 nm to about 1100 nm to convert the light into heat. Preferably, the light-to-heat conversion layer may be formed of a composition comprising: about 5 wt % to about 20 wt % of the light-to-heat conversion material, for example, about 5 wt %, 6 wt %, 7 wt %, 8 wt %, 9 wt %, 10 wt %, 11 wt %, 12 wt %, 13 wt %, 14 wt %, 15 wt %, 16 wt %, 17 wt %, 18 wt %, 19 wt %, 20 wt %, 21 wt %, 22 wt %, 23 wt %, 24 wt %, 25 wt %, 26 wt %, 27 wt %, 28 wt %, 29 wt %, or 30 wt % of the light-to-heat conversion material; about 70 wt % to about 85 wt % of the binder, for example, about 70 wt %, 71 wt %, 72 wt %, 73 wt %, 74 wt %, 75 wt %, 76 wt %, 77 wt %, 78 wt %, 79 wt %, 80 wt %, 81 wt %, 82 wt %, 83 wt %, 84 wt % or 85 wt % of the binder; and about 1 wt % to about 10 wt % of the initiator, for example, about 1 wt %, 2 wt %, 3 wt %, 4 wt %, 5 wt %, 6 wt %, 7 wt %, 8 wt %, 9 wt %, or 10 wt %, preferably about 1 wt % to about 5 wt % of the initiator, in terms of solid content.

The composition for the light-to-heat conversion layer may further include a solvent. The solvent of the composition for the light-to-heat conversion layer may include any solvent so long as the solvent can be used in the composition for the light-to-heat conversion layer. Examples of the solvent may include methylethylketone and propyleneglycolmonomethylether acetate, without being limited thereto.

The light-to-heat conversion layer may have a thickness of about 1 µm to about 10 µm, preferably about 2 µm to about 5 µm. Within this range, the light-to-heat conversion layer can be applied to the thermal transfer film.

The thermal transfer film according to the embodiment may be manufactured by a typical method. For example, the thermal transfer film may be manufactured by coating the composition for the light-to-heat conversion layer and the composition for the coating layer onto the upper and lower sides of the base film, respectively, followed by drying and UV curing at about 200 mJ/cm$^2$ to about 500 mJ/cm$^2$ under a nitrogen atmosphere.

Figure 2:
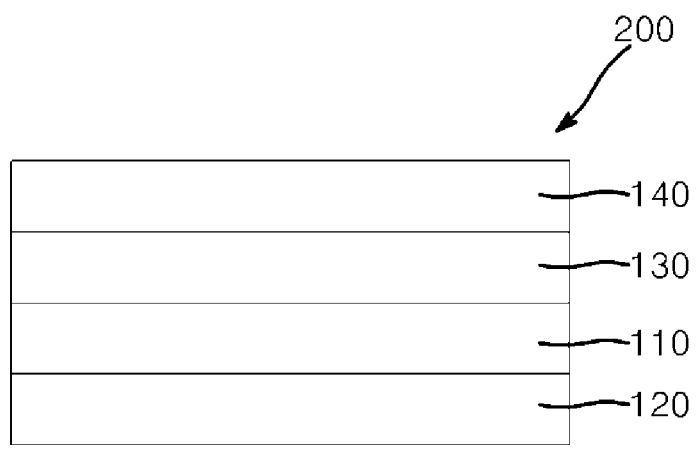
FIG. 2 is a cross-sectional view of a thermal transfer film according to another embodiment of the present invention.

Next, a thermal transfer film according to another embodiment will be described with reference to FIG. 2. FIG. 2 is a cross-sectional view of a thermal transfer film according to another embodiment of the invention.

Referring to FIG. 2, a thermal transfer film 200 according to another embodiment of the invention may include a base film 110, a coating layer 120 formed on a lower side of the film 110, a light-to-heat conversion layer 130 formed on an upper side of the base film 110, and an interlayer 140 formed on an upper side of the light-to-heat conversion layer 130. The thermal transfer film according to this embodiment is substantially the same as the thermal transfer film of the above embodiment except that the interlayer is formed on the upper side of the light-to-heat conversion layer in this embodiment. The interlayer can protect the light-to-heat conversion layer while improving transfer efficiency of the thermal transfer film through volume expansion of the interlayer. Hereinafter, the interlayer will be described in more detail.

The interlayer may be formed of a composition including a UV curable resin, a polyfunctional monomer, and an initiator. The composition for the interlayer may further include a UV curable fluorine compound.

The UV curable resin may include a polyfunctional resin, for example, a di- or higher-functional non-fluorine resin. Specifically, the UV curable resin may include at least one of urethane (meth)acrylate resins, phenolic resins, polyvinyl butyral resins, polyvinylacetate resins, polyvinylacetal resins, polyvinylidene chloride resins, cellulose ether resins, cellulose ester resins, nitrocellulose resins, polycarbonate resins, polyalkyl (meth)acrylate resins including polymethyl methacrylate and the like, epoxy (meth)acrylate resins, epoxy resins, urethane resins, ester resins, ether resins, alkyd resins, spiroacetal resins, polybutadiene resins, polythiolpolyene resins, (meth)acrylate resins of polyfunctional compounds of polyhydric alcohols, and acrylic resins, without being limited thereto.

The polyfunctional monomer may be a di- or higher functional monomer, preferably a tri-functional to hexa-functional non-fluorine monomer that is free from fluorine, and may be a polyfunctional (meth)acrylate derived from hydroxyl groups of a polyhydric alcohol. For example, the polyfunctional monomer may include at least one of ethyleneglycol di(meth)acrylate, propyleneglycol di(meth)acrylate, diethyleneglycol di(meth)acrylate, triethyleneglycol di(meth)acrylate, 1,4-butanediol di(meth)acrylate, 1,6-hexanediol di(meth)acrylate, neopentylglycol di(meth)acrylate, pentaerythritol di(meth)acrylate, pentaerythritol tri (meth)acrylate, pentaerythritol tetra(meth)acrylate, dipentaerythritol di(meth)acrylate, dipentaerythritol tri(meth)acrylate, dipentaerythritol penta(meth)acrylate, dipentaerythritol hexa(meth)acrylate, bisphenol A di(meth)acrylate, trimethylolpropane tri(meth)acrylate, ditrimethylolpropane tri(meth)acrylate, and ditrimethylolpropane tetra(meth)acrylate.

The initiator may be the same as described above.

The UV curable fluorine compound may include the compound represented by Formula 1.

The interlayer may be formed of a composition comprising: about 40 wt % to about 90 wt % of the UV curable resin, preferably about 55 wt % to about 90 wt %, or about 40 wt % to about 80 wt %, for example, about 40 wt %, 41 wt %, 42 wt %, 43 wt %, 44 wt %, 45 wt %, 46 wt %, 47 wt %, 48 wt %, 49 wt %, 50 wt %, 51 wt %, 52 wt %, 53 wt %, 54 wt %, 55 wt %, 56 wt %, 57 wt %, 58 wt %, 59 wt %, 60 wt %, 61 wt %, 62 wt %, 63 wt %, 64 wt %, 65 wt %, 66 wt %, 67 wt %, 68 wt %, 69 wt %, 70 wt %, 71 wt %, 72 wt %, 73 wt %, 74 wt %, 75 wt %, 76 wt %, 77 wt %, 78 wt %, 79 wt %, 80 wt %, 81 wt %, 82 wt %, 83 wt %, 84 wt %, 85 wt %, 86 wt %, 87 wt %, 88 wt %, 89 wt % or 90 wt % of the UV curable resin; about 5 wt % to about 30 wt % of the polyfunctional monomer, for example, about 5 wt %, 6 wt %, 7 wt %, 8 wt %, 9 wt %, 10 wt %, 11 wt %, 12 wt %, 13 wt %, 14 wt %, 15 wt %, 16 wt %, 17 wt %, 18 wt %, 19 wt %, 20 wt %, 21 wt %, 22 wt %, 23 wt %, 24 wt %, 25 wt %, 26 wt %, 27 wt %, 28 wt %, 29 wt %, or 30 wt % of the polyfunctional monomer; optionally about 10 wt % or less of the UV curable fluorine compound, for example, about 0 wt %, 1 wt %, 2 wt %, 3 wt %, 4 wt %, 5 wt %, 6 wt %, 7 wt %, 8 wt %, 9 wt %, or 10 wt % of the UV curable fluorine compound; and about 0.1 wt % to about 5 wt % of the initiator, for example, about 0.1 wt %, 1 wt %, 2 wt %, 3 wt %, 4 wt %, or 5 wt % of the initiator. Within this range of the composition, the interlayer can allow efficient transfer of the transfer layer. Preferably, the composition for the interlayer may comprise about 60 wt % to about 90 wt %, more preferably about 60 wt % to about 80 wt %, still more preferably about 60 wt % to about 75 wt % of the UV curable resin; about 10 wt % to about 30 wt % of the polyfunctional monomer; about 0.1 wt % to about 5 wt % of the UV curable fluorine compound; and 1 wt % to about 5 wt % of the initiator.

The interlayer may have a thickness of about 1 μm to about 10 μm, preferably about 2 μm to about 5 μm. Within this range, the interlayer may be applied to the thermal transfer film.

Before or after roll winding of the thermal transfer film, the interlayer may have small variation in surface roughness and has a surface roughness Rqv of about 50 nm or less, preferably about 40 nm or less, more preferably about 1 nm to about 34 nm. In addition, before or after roll winding of the thermal transfer film, the interlayer may have small variation in surface roughness and has a surface roughness Rq of 5 nm or less, preferably about 3 nm or less, more preferably about 0.1 nm to about 2.0 nm. Within this range, the interlayer of the thermal transfer film may have low surface roughness, thereby preventing transfer failure.

The composition for the interlayer may further include a solvent. The solvent of the composition for the interlayer may include any solvent without limitation, and may include, for example, methylethylketone and propyleneglycol monomethyletheracetate.

The thermal transfer film according to this embodiment may be manufactured by a typical method. For example, the composition for the light-to-heat conversion layer and the composition for the coating layer are coated onto the upper and lower sides of the base film, respectively, and dried. Then, the composition for the interlayer is coated onto the coating layer of the composition for the light-to-heat conversion layer and dried. Then, the composition for the interlayer is cured by UV irradiation at about 200 mJ/cm$^2$ to about 500 mJ/cm$^2$ under a nitrogen atmosphere, thereby fabricating a thermal transfer film.

The thermal transfer film according to the embodiments may be used as a donor film for OLEDs and for laser transfer, without being limited thereto. When the thermal transfer film is used as a donor film for laser transfer in an organic electroluminescent device formed of an organic material, the thermal transfer film does not suffer from transfer failure. The thermal transfer film wound on a roll may be used for thermal transfer after separating the coating layer from the thermal transfer film.

The thermal transfer film according to the embodiments may further include a transfer layer stacked on the light-to-heat conversion layer or interlayer, which is an outermost layer of the thermal transfer film. The transfer layer may include a transfer material, such as organic electroluminescent (EL) materials and the like. When the transfer layer is irradiated with a laser beam at a specific wavelength while adjoining a receptor having a specific pattern, the light-to-heat conversion layer expands to generate heat through absorption of light, whereby the transfer material of the transfer layer is thermally transferred to the receptor corresponding to the pattern.

The transfer layer may include at least one layer to transfer the transfer material to the receptor. The at least one layer may be formed of organic, inorganic, organometallic and other materials, which include electroluminescent or electrically active materials. The transfer layer may be uniformly coated by evaporation, sputtering or solvent coating, or may be printed in a pattern to be formed on the light-to-heat conversion layer by digital printing, lithography or evaporation, or sputtering through a mask.

A method for manufacturing a thermal transfer film according to one embodiment of the invention may include forming a coating layer on a lower side of the base film, and forming a light-to-heat conversion layer on an upper side of the base film.

The operation of forming a coating layer may include coating a composition for the coating layer on the lower side of the base film, followed by curing. The operation of forming a light-to-heat conversion layer may include coating a composition for the light-to-heat conversion layer on the upper side of the base film, followed by curing. Curing of the composition for the coating layer and curing of the composition for the light-to-heat conversion layer may be performed at the same time or sequentially. The present invention is not limited to a certain curing sequence.

The method may further include coating a composition for an interlayer after coating the composition for the light-to-heat conversion layer.

The method may further include separating the coating layer from the thermal transfer film.

The method may further include winding the thermal transfer film on a roll.

In accordance with another aspect of the invention, an organic electroluminescent device (including an OLED) may be fabricated using the thermal transfer film. Specifically, a donor film is disposed on a substrate on which a transparent electrode layer is formed. The donor film is a film in which the base layer, the light-to-heat conversion layer and the transfer layer are stacked, as described above.

The donor film is irradiated with light from a certain energy source. The light passes through the base layer via a transfer apparatus to activate the light-to-heat conversion layer, which in turn emits heat through pyrolysis. The transfer layer is separated from the donor film through expansion of the light-to-heat conversion layer in the donor film by the emitted heat, whereby a light emitting layer, which is a transfer material, is transferred to a desired thickness and pattern onto a pixel domain defined by a pixel defining layer on a substrate of the organic electroluminescent device.

MODE FOR INVENTION

Hereinafter, the present invention will be described in more detail with reference to some examples. However, it should be understood that these examples are provided for illustration only and are not to be in any way construed as limiting the present invention.

Preparative Example 1

Composition for Light-to-Heat Conversion Layer 25 g of polymethylmethacrylate and 40 g of an epoxy acrylate binder as a UV curable resin, 17 g of a tri-functional acrylate monomer (SR351, Sartomer Co., Ltd.) as a polyfunctional monomer, and 3 g of Irgacure 184 (BASF) were mixed to prepare a mixture. 15 g of carbon black was added to the mixture, followed by stirring for 30 minutes, thereby preparing a composition for a light-to-heat conversion layer.

Preparative Example 2

Composition for Interlayer 17.99 g of a hexa-functional urethane acrylate oligomer (CN9006, Sartomer Co., Ltd.) as a UV curable resin, 7.44 g of a tri-functional acrylate monomer (SR351, Sartomer Co., Ltd.) as a polyfunctional monomer, and 0.62 g of 1H,1H,10H,10H-perfluoro-1,10-decanediol diacrylate (Exfluor Research Corporation) as a UV curable fluorine compound were added to a mixture of 47.15 g of methylethylketone (MEK) and 26.05 g of propyleneglycolmonomethylether acetate, followed by stirring for 30 minutes. As an initiator, 0.75 g of Irgacure 184 (BASF) was added to the resulting mixture, followed by finally stirring for 30 minutes, thereby preparing a composition for an interlayer.

Preparative Example 3

Composition for Coating Layer 17.99 g of a hexa-functional urethane acrylate oligomer (CN9006, Sartomer Co., Ltd.) as a UV curable resin, 7.44 g of a tri-functional acrylate monomer (SR351, Sartomer Co., Ltd.) as a polyfunctional monomer, and 0.62 g of 1H,1H,10H,10H-perfluoro-1,10-decanediol diacrylate (Exfluor Research Corporation) as a UV curable fluorine compound were added to a mixture of 47.15 g of MEK and 26.05 g of propyleneglycolmonomethylether acetate, followed by stirring for 30 minutes. As a photopolymerization initiator, 0.75 g of Irgacure 184 (BASF) was added to the resulting mixture, followed by finally stirring for 30 minutes, thereby preparing a composition for a coating layer.

Example 1

The composition of Preparative Example 3 was coated onto one surface of a base film (polyethylene terephthalate film, A1598, including a primer formed over the surface thereof, surface roughness Rqv: 80 nm, Rq: 13 nm), on which the primer was formed, followed by drying in an oven at 80° C. for 2 minutes and curing at 300 mJ/cm$^2$ under a nitrogen atmosphere, thereby preparing a 2 μm thick coating layer. The composition of Preparative Example 1 was coated onto the other surface of the base film, followed by drying in an oven at 80° C. for 2 minutes. Then, curing was performed by irradiation at 300 mJ/cm$^2$ under a nitrogen atmosphere, thereby fabricating a thermal transfer film including the coating layer and a light-to-heat conversion layer.

Example 2

The composition of Preparative Example 3 was coated onto one surface of a base film (polyethylene terephthalate film, A1598, including a primer formed on the surface thereof, surface roughness Rqv: 80 nm, Rq: 13 nm), on which the primer was formed, followed by drying in an oven at 80° C. for 2 minutes. The composition of Preparative Example 1 was coated onto the other surface of the base film, followed by drying in an oven at 80° C. for 2 minutes. The composition of Preparative Example 2 was coated onto the light-to-heat conversion layer formed of the composition of Preparative Example 1, followed by drying in an oven at 80° C. for 2 minutes. Then, curing was performed by irradiation at 300 mJ/cm$^2$ under a nitrogen atmosphere, thereby fabricating a thermal transfer film including a 3 μm thick light-to-heat conversion layer, a 2 μm thick coating layer and a 2 μm thick interlayer.

Comparative Example 1

A thermal transfer film was fabricated in the same manner as in Example 1 except that the composition of Preparative Example 1 was used and the composition of Preparative Example 3 was not used.

Comparative Example 2

A thermal transfer film was fabricated in the same manner as in Example 2 except that the compositions of Preparative Examples 1 and 2 were used and the composition of Preparative Example 3 was not used.

Comparative Example 3

A thermal transfer film was fabricated in the same manner as in Example 2 except that a PET protective film was stacked on the layer formed of the composition of Preparative Example 2 instead of coating the composition of Preparative Example 3.

Figure 4:
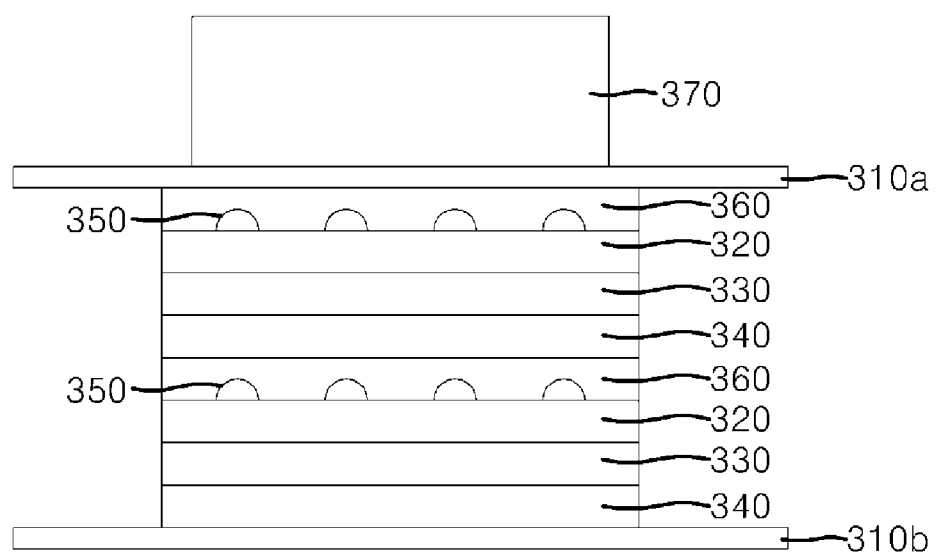
FIG. 4 is a cross-sectional view of a sample prepared for confirming formation of indentations by a primer in experimental examples.

Each of the thermal transfer films prepared in Examples and Comparative Examples was placed as shown in FIG. 4 and was evaluated as to whether indentations were formed due to the primer.

Referring to FIG. 4, two thermal transfer films of Example 2 (10 cm×10 cm, length×width) (thermal transfer films in which a light-to-heat conversion layer 330 and an interlayer 340 were sequentially stacked on a base film 320 including a primer 350 and a coating layer 360) were stacked between glass plates 310a, 310b, and then pressed by a weight 370 of 1 kg. After the thermal transfer films were left in an oven at 50° C. for 24 hours, surface roughness of the interlayer was measured using an Atomic Force Microscope (XE-100, Park Systems Co., Ltd., Korea). After a sample was cut at a position to be analyzed and then attached to a sample mount to which a carbon tape was attached, a contact mode or a non-contact mode was set as a head mode, and PSPD Display Window: A+B was set to 1 V, and A-B was set to −500 mV~+500 mV to measure surface roughness. Surface roughness of each of the thermal transfer films prepared in Comparative Examples was measured in the same manner as in Examples. Here, since the thermal transfer films of Example 1 and Comparative Example 1 did not include the interlayer, the interlayer was omitted in the arrangement shown in FIG. 4.

TABLE 1

|  |  | Example 1 | Example 2 | Comparative Example 1 | Comparative Example 2 | Comparative Example 3 |
|---|---|---|---|---|---|---|
| Surface roughness of coating layer (primer covering layer) (nm) | Rqv | 43.6 | 38.7 | — | — | — |
|  | Rq | 1.68 | 1.47 | — | — | — |
| Surface roughness of interlayer (nm) | Rqv | — | 33.005 | — | 190.396 | 84.2 |
|  | Rq | — | 1.397 | — | 12.742 | 3.43 |
| Surface roughness of light-to-heat conversion layer (nm) | Rqv | 37.2 | — | 210.37 | — | — |
|  | Rq | 1.76 | — | 11.548 | — | — |

As shown in Table 1, the thermal transfer films of the present invention could prevent transfer failure upon transfer of the transfer layer by significantly lowering the surface roughness of the interlayer contacting the base film having the primer.

Conversely, the thermal transfer film of Comparative Example 2, which did not include the coating layer, had much higher surface roughness than the thermal transfer films of the present invention and thus could not realize advantageous effects of the present invention. In addition, the thermal transfer film of Comparative Example 3, in which a typical release film was used instead of the coating layer, also had much higher surface roughness than the thermal transfer films of the present invention and thus could not realize advantageous effects of the present invention.

It should be understood that various modifications, changes, alterations, and equivalent embodiments can be made by those skilled in the art without departing from the spirit and scope of the invention.

The invention claimed is:

1. A thermal transfer film comprising:
a base film having a first surface and a second surface opposing the first surface;
a light-to-heat conversion layer formed on the first surface of the base film; and
a coating layer formed on the second surface of the base film,
wherein the coating layer is a fluorine-based coating layer.

2. The thermal transfer film according to claim 1, wherein the light-to-heat conversion layer has a surface roughness Rqv of about 50 nm or less.

3. The thermal transfer film according to claim 1, wherein the light-to-heat conversion layer has a surface roughness Rq of about 5 nm or less.

4. The thermal transfer film according to claim 1, wherein the coating layer has a haze of about 2% or less.

5. The thermal transfer film according to claim 1, wherein the coating layer has a thickness of about 5 μm or less.

6. The thermal transfer film according to claim 1, wherein the coating layer is formed of a composition comprising a UV curable resin, a polyfunctional monomer, an initiator, and a UV curable fluorine compound.

7. The thermal transfer film according to claim 6, wherein the UV curable fluorine compound is represented by Formula 1,

(wherein $R^1$ is a hydrogen atom, or a linear or branched $C_1$ to $C_5$ alkyl group, and $R^f$ has one structure of Formulae a to e:

wherein * is a binding site for $CH_2=CR^1-C(=O)-O$ represented by Formula 1;
$R^{F1}$ is a linear or branched $C_1$ to $C_{10}$ fluoroalkylene group, or a linear or branched $C_1$ to $C_{10}$ perfluoroalkylene group; and
$R^{F2}$, $R^{F3}$, $R^{F4}$, $R^{F5}$ are each independently a hydrogen atom, a linear or branched to $C_{14}$ fluoroalkyl group, or a linear or branched $C_1$ to $C_{14}$ perfluoroalkyl group.

8. The thermal transfer film according to claim 1, wherein the coating layer comprises a cured product of a composition comprising about 40 wt % to about 90 wt % of a UV curable resin, about 5 wt % to about 45 wt % of a polyfunctional monomer, optionally about 10 wt % or less of a UV curable fluorine compound, and about 0.1 wt % to about 5 wt % of an initiator.

9. The thermal transfer film according to claim 1, further comprising:
a protection layer on an upper side of the light-to-heat conversion layer.

10. The thermal transfer film according to claim 9, wherein the protection layer has a surface roughness Rqv of about 50 nm or less.

11. The thermal transfer film according to claim 9, wherein the protection layer has a surface roughness Rq of about 5 nm or less.

12. The thermal transfer film according to claim 1, wherein the base film comprises at least one of polyester resins, polyacrylic resins, polyepoxy resins, polyolefin resins, and polystyrene resins.

13. A method for manufacturing the thermal transfer film according to claim 1, comprising:
- coating a composition for the coating layer onto the second surface of the base film;
- coating a composition for the light-to-heat conversion layer onto the first surface of the base film; and
- curing the composition for the coating layer and the composition for the light-to-heat conversion layer.

14. The method according to claim 13, further comprising: winding the thermal transfer film on a roll.

15. The method according to claim 13, further comprising: coating a composition for a protective layer after coating the composition for the light-to-heat conversion layer.

16. The method according to claim 13, further comprising: separating the coating layer from the thermal transfer film.

17. An organic electroluminescent device manufactured using the thermal transfer film according to claim 1.

* * * * *